United States Patent

Bull et al.

[11] Patent Number: 5,822,186
[45] Date of Patent: Oct. 13, 1998

[54] AUXILIARY ELECTRICAL COMPONENT UTILIZED ON THE EXTERIOR OF AN ELECTRICAL DEVICE THAT CAN BE REMOVED WHEN THE ELECTRICAL DEVICE IS POWERED

[75] Inventors: William H. Bull, Los Gatos; Mark P. McNally, San Francisco, both of Calif.

[73] Assignee: Apple Computer, Inc., Cupertino, Calif.

[21] Appl. No.: 606,069

[22] Filed: Feb. 23, 1996

[51] Int. Cl.$^6$ ...................................................... H05K 7/20
[52] U.S. Cl. ........................ 361/695; 165/80.3; 361/687; 415/213.1
[58] Field of Search ........................ 124/16.1; 312/223.1, 312/223.2; 165/80.3, 122, 126; 454/184; 416/223 R; 415/115, 177, 178, 208.3, 213.1, 214.1; 361/687, 690–695

[56] References Cited

U.S. PATENT DOCUMENTS

| | | | |
|---|---|---|---|
| 4,383,286 | 5/1983 | Hicks | 361/389 |
| 4,869,681 | 9/1989 | Vache | 439/341 |
| 4,972,296 | 11/1990 | Chu | 361/391 |
| 5,097,388 | 3/1992 | Buist | 361/393 |
| 5,446,619 | 8/1995 | Madsen | 361/695 |
| 5,523,917 | 6/1996 | Searby | 361/687 |
| 5,562,410 | 10/1996 | Sachs | 415/213.1 |

FOREIGN PATENT DOCUMENTS 1438609  6/1976  United Kingdom .................. 361/687

*Primary Examiner*—Gerald P. Tolin
*Attorney, Agent, or Firm*—Sawyer & Associates

[57] ABSTRACT

A removable auxiliary electrical component for an electrical device that can be removed when the electrical device is powered is disclosed. The removable axillary electrical component includes a module located on an exterior portion of an electrical product. The removable axillary electrical component also includes a guard member connected to an electrical product. The electrical product includes an electrical contact portion connected to a power source of the electrical product, and a housing member containing a first electrical portion of the module. The electrical portion includes a second contact portion, the second contact portion is used for mateably engaging the first contact portion. The housing portion also includes a snap member for removable engagement with the exterior portion of the electrical product.

15 Claims, 4 Drawing Sheets

AUXILIARY ELECTRICAL COMPONENT UTILIZED ON THE EXTERIOR OF AN ELECTRICAL DEVICE THAT CAN BE REMOVED WHEN THE ELECTRICAL DEVICE IS POWERED

FIELD OF THE INVENTION

The present invention relates to auxiliary electrical components located on an electrical device, and more particularly to an electrical component that is utilized on the exterior of a larger electrical device.

BACKGROUND OF THE INVENTION

Oftentimes, electrical components are utilized in conjunction with other electrical devices to provide an auxiliary service. For example, a component, such as a fan module, is oftentimes used on a computer to allow the fan to cool the components of a computer. Sometimes, these components, such as a fan module, are located in the interior of the computer. However, as more and more components are required in such computers, it is oftentimes necessary to assemble such modules on the outside of such components.

Accordingly, there is a need to provide such components on the outside of a device, and still make these auxiliary components easily replaceable. It is also desirable that such components be easily replaceable without interrupting the operation of the device to which it is attached. Such removability would require safety in that there would be electrical components and the like which could shock the user as well expose the equipment to further damage. Accordingly, what is needed is a system for providing such replaceable auxiliary component. The component should be easy to handle, safe to remove and not affect the operation of the equipment. The present invention addresses such a need.

SUMMARY OF THE INVENTION

A removable auxiliary electrical component for an electrical device that can be removed when the electrical device is powered is disclosed. The removable axillary electrical component includes a module located on an exterior portion of an electrical product. The removable axillary electrical component also includes a guard member connected to an electrical product. The electrical product includes an electrical contact portion connected to a power source of the electrical product, and a housing member containing a first electrical portion of the module. The electrical portion includes a second contact portion, the second contact portion is used for mateably engaging the first contact portion. The housing portion also includes a snap member for removable engagement with the exterior portion of the electrical product.

The present invention satisfies the need to quickly and easily remove and replace an electrical component that is on the exterior of a large product. In a preferred embodiment, the component is a fan module, and the product is a computer that the fan module is assembled onto for cooling. A feature of the present invention is that the fan module can be easily released from and reattached to the computer housing, and no additional labor is involved to make the electrical connection to power the fan during this process. When the fan is removed from the housing, the electrical connection is simultaneously broken. Further, when the fan is attached to the housing, the electrical connection is simultaneously reinstated.

Another feature of the present invention is that the fan module may be removed or attached while the computer is in operation. A sheet metal cage covers the opening of the computer housing to prevent the user from inserting a hand or finger into the opening and subsequently getting an electrical shock. The sheet metal cage also acts as an electromagnetic interference shield for the computer housing. Also, the user cannot touch the "live" electrical contacts that connect the fan to the housing when the fan is removed. The present invention is designed in such a way that only the fan and the plastic grill are seen once the fan is replaced, since the fan module is on the exterior of the product and any exposed cabling or metal parts would detract from the appearance of the fan. Additionally, there are no exposed wires, finger access to the fan blades, sharp edges, or any type of electrical hazard.

DESCRIPTION OF THE INVENTION

The present invention relates to an improvement in an auxiliary module which is utilized with an electrical device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The following description will describe the use of this auxiliary module as a fan module associated with a computer. One of ordinary skill in the art would recognize that there could be a variety of other types of modules that could be utilized as auxiliary modules with a device. For example, the module could be a speaker on a CD player, computer or tape recorder. Also, it could be a keypad or diagnostic module inserted for diagnostic purposes, then removed and replaced with a blank panel or other device. In another example, it could be a LCD or other display module on the front of a computer or appliance. In a further example, it could also be a method of upgrading to a more powerful fan for improved cooling. In addition, it could also be a method of upgrading or allowing the customer to choose which of several models of any of these mentioned devices that the user desires to use.

The key feature of the present invention is that these concepts could apply to any auxiliary device that is replaceable, and this replaceability would not affect the operation of the larger system if the device is replaced while the system is powered on. The following discussion, in conjunction with the figures, will describe the basic concepts of the present invention in more detail.

Figure 1:
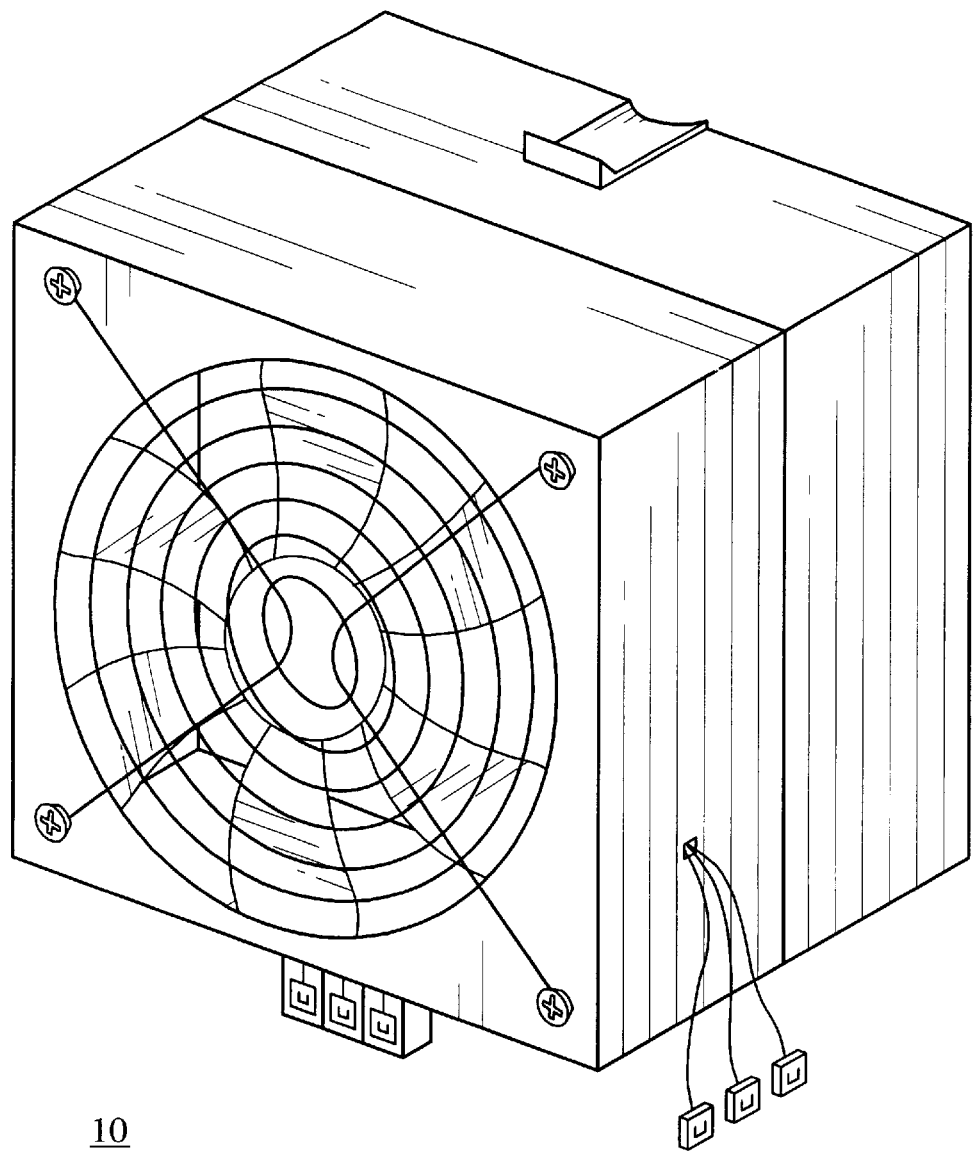
FIG. 1 is a perspective view of a fan module in accordance with the present invention.
Figure 2:
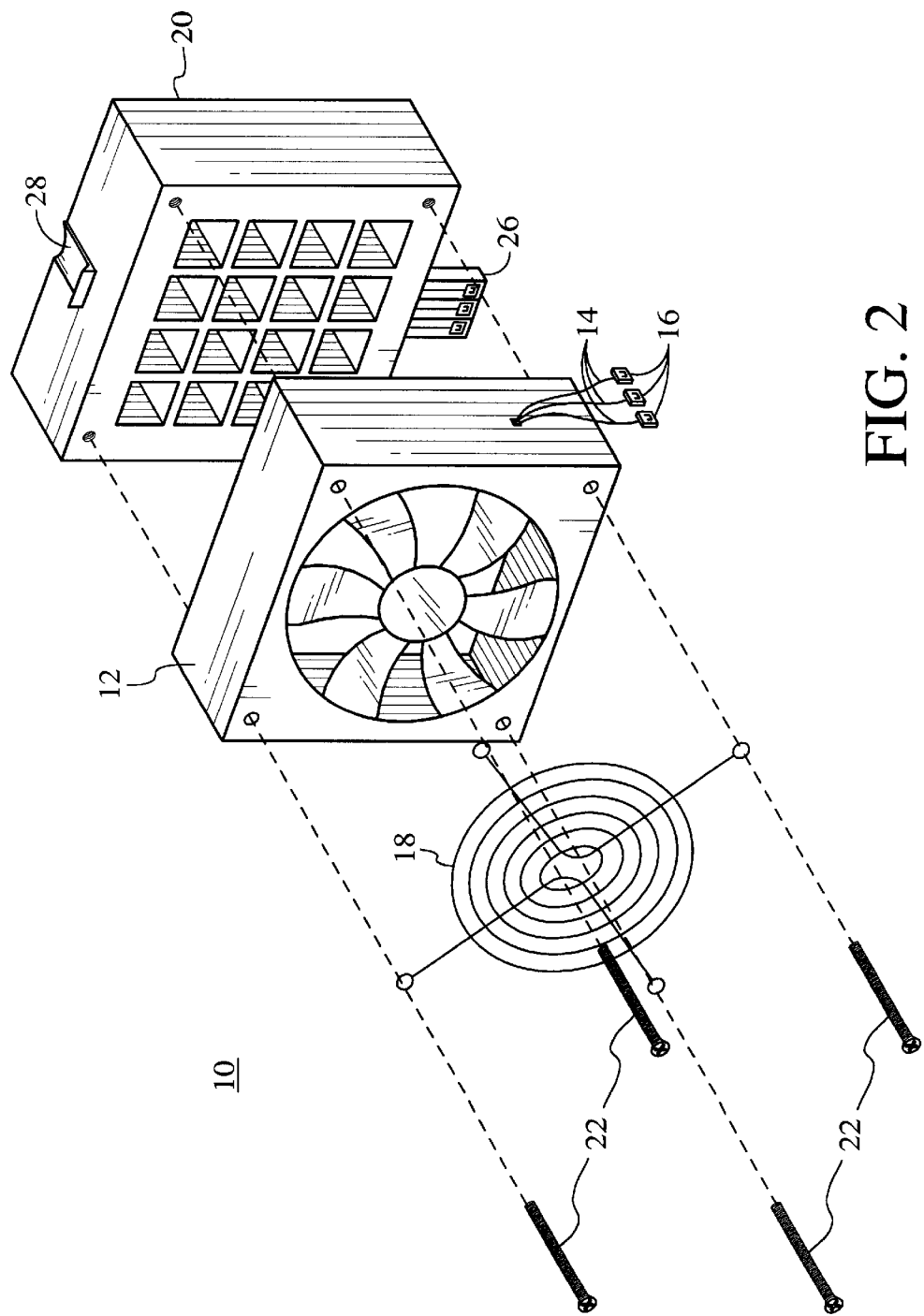
FIG. 2 is an exploded view of the fan module in accordance with the present invention.

Referring now to FIGS. 1 and 2, what are shown are perspective and exploded views of the fan module 10 in accordance with the present invention. The fan module 10 of the present invention comprises a fan 12 which includes cabling 14. The cabling 14 is coupled to electrical contacts 16. A guard 18 is fastened to a plastic grill 20 by screws 22. The screws 22 are inserted through the guard 18 and fan 12, then tightened into inserts on the plastic grill 20. The fan 12 is protected on both sides by the guard 18 and by the plastic grill 20, so that the user cannot put their fingers into the fan while it is in operation, or when it is still spinning immediately after removal. In a preferred embodiment, the plastic housing has slots (not shown) for the cabling 14 to be pressed into to hold it in place so that the cabling does not interfere with assembly.

Figure 3:
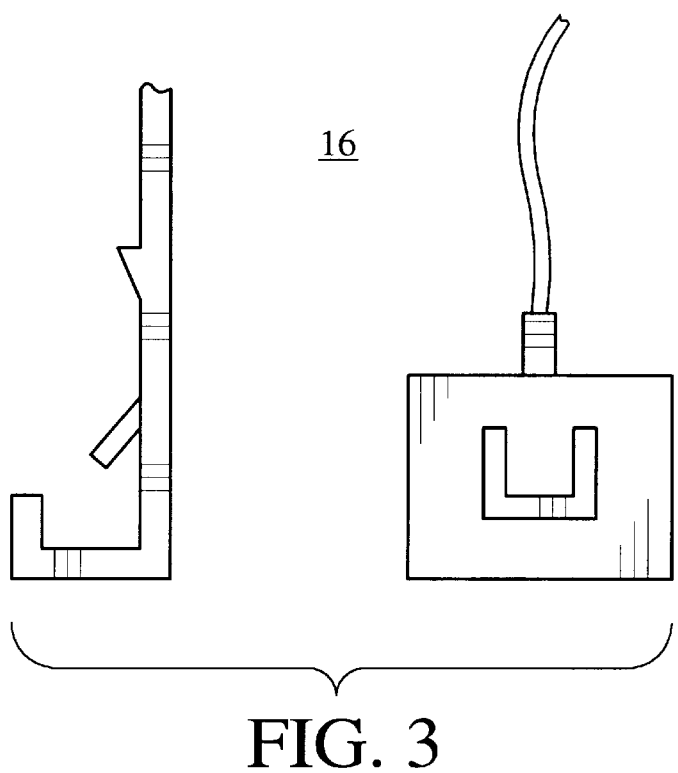
FIG. 3 is a diagram of the contacts associated with the fan module in accordance with the present invention.

Referring now to FIG. 3, what is shown is a diagram of the contacts 16 associated with the fan module 10 in accordance with the present invention. The plastic grill 20 has a hook 26 onto which the contacts 16 are easily attached that hooks the contacts 16 into place during assembly, and properly aligns the contacts 16 automatically to make electrical contact when the fan module 10 is inserted into the housing 102. There is also a snap 28 on the opposite side of the plastic grill 20 to hold the grill 20 in place on the housing 102, and yet allows for easy removal of the fan module.

Figure 4:
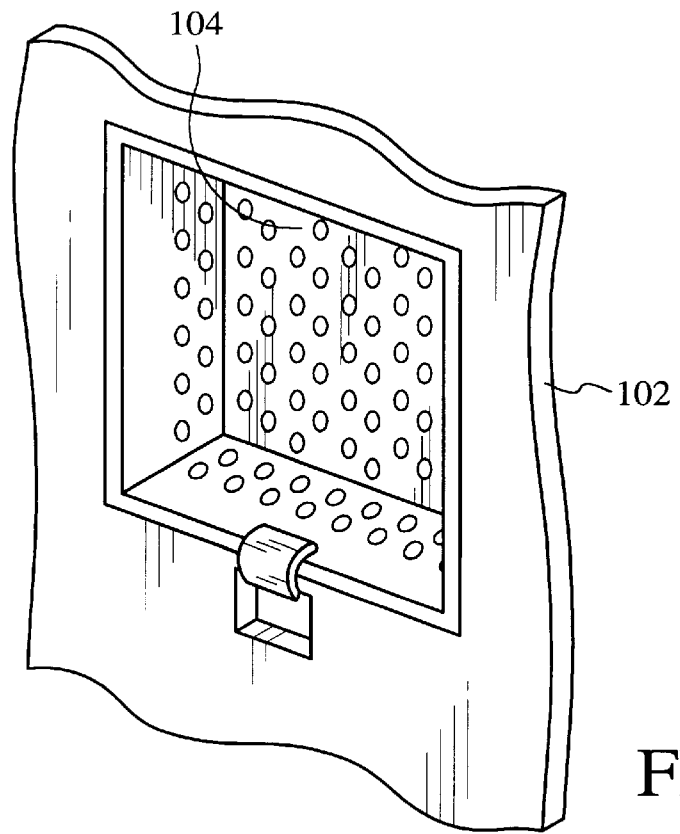
FIG. 4 is a diagram of the sheet metal cage associated with the housing of the fan module in accordance with the present invention.

Referring now to FIG. 4, what is shown is a diagram of the sheet metal cage 104 associated with the housing 102 of the fan module in accordance with the present invention. The opening on the sheet metal wall on the computer housing 102 is filled in with the sheet metal cage 104 that is formed into the shape of a box to provide a space for the fan module 10 to sit into when assembled to the housing. As previously discussed in FIG. 2, this secondary sheet metal cage 104, hereinafter referred to as the fan cage 104, is a guard to prevent the user from putting their hand or finger into the opening and getting an electrical shock, since the removal of the fan module 10 occurs when the computer is in operation. The fan cage 104 also creates an electromagnetic interference shield for the computer housing 102. The fan cage 104 has an array of holes 106 in it to allow air flow for the fan to perform the operation of cooling the computer housing 102. In addition, in a preferred embodiment, two small openings exist, one on the lower opening 108 and one on the upper opening 110. The lower opening 108 provides an area for the hook portion 26 of the fan module 10 to insert into that contains the contacts 16. The upper opening 110 accepts the snap 28 on the fan module 10. Inside the housing 102, below the lower opening 108 are mating contacts 112 which connect to the contacts on the fan module 10. The opening 108 just above the mating contacts 112 is designed so that a finger cannot be inserted to touch the mating contacts 112 and cause an electrical shock. It is this unique configuration of the fan module 10, combined with the manner in which the fan module rotates during insertion that allows the mating contacts 112 to be in a location that is not accessible by the user when the fan module is removed. Otherwise, the mating contacts 112 would be a serious safety concern.

Figure 6:
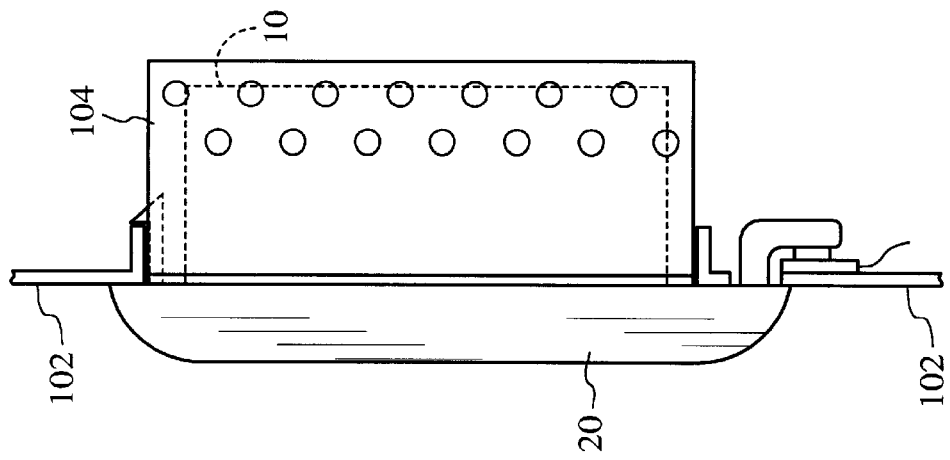
FIG. 6 is a diagram of the module inserted in the sheet metal area in accordance with the closed position.
Figure 5:
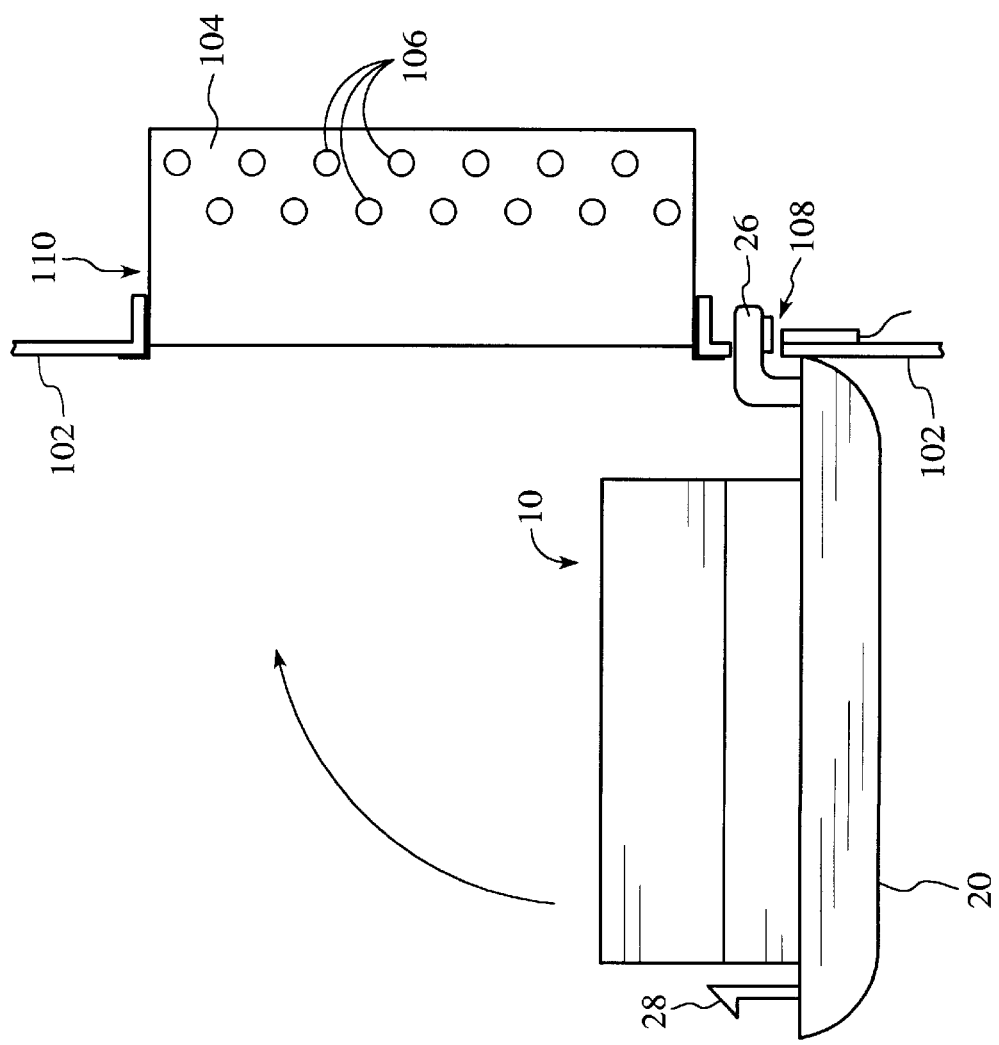
FIG. 5 is a diagram of the module inserted in the sheet metal area in a first position.

Referring now to FIG. 5, what is shown is a diagram of the module 10 inserted in the sheet metal cage 104 in a first position. To assemble the fan module 10 to the housing 102, the hook portion 26 on the bottom of the fan module 10 is inserted into the lower opening 108 on the housing 102 while the fan module 10 is in a horizontal position. Then, the fan module 10 is rotated up into place until the snap 28 of the grill 20 snaps into place on the housing 102, as shown in FIG. 6. When the fan module 10 is rotated into position, electrical contact is being made simultaneously, and the fan begins operation. To remove the fan module 10, the top edge is pressed to release the snap 28, the fan module 10 rotates down, and can be removed from the housing 102.

Of course, one of ordinary skill in the art would readily recognize that the auxiliary component could comprise of a variety of other electrical components, and those variations would be within the spirit and scope of the present invention. It is also recognized that the product could be any other electrical product which contains replaceable parts. In addition, the fan could rotate horizontally or vertically, and either usage would be within the spirit and scope of the present invention.

Although the present invention has been described in accordance with the embodiments shown in the figures, one of ordinary skill in the art recognizes there could be variations to the embodiments and those variations would be within the spirit and scope of the present invention. Accordingly, many modifications may be made by one of ordinary skill in the art without departing from the spirit and scope of present invention, the scope of which is defined by the appended claims.

We claim:

1. A system for locating a module on an exterior portion of an electrical product comprising:

a housing member coupled to the electrical product, the housing member including a first electrical contact portion coupled to a power source of the electrical product, the housing member having a first aperture therein, the first aperture having a central portion, the first electrical contact portion being recessed in the first aperture and offset from the central portion of first aperture to be inaccessible to a user from the exterior portion of the electrical product; and a grill member containing an electrical portion of the module, the electrical portion including a second contact portion, the second contact portion mateably engaging the first contact portion, the grill member including a snap portion and a hook portion which facilitate removable engagement with the exterior portion of the electrical product and engagement of the second contact portion with the first contact portion.

2. The system of claim 1 in which the hook portion engages the first aperture within the housing member and rotation of the grill member and engagement of the snap portion with a second aperture in the housing member facilitates attachment of the module to the exterior portion of the electrical product.

3. The system of claim 2 wherein the first aperture further comprises a shape, the shape being such that a finger of the user cannot be inserted through the first aperture to touch the first contact portion.

4. The system of claim 1 in which the module comprises a fan module.

5. The system of claim 4 in which the electrical portion of the grill member comprises:

a fan including a cable; and a plurality of contacts coupled to the cable.

6. The system of claim 5 in which the module further includes a guard member coupled to the grill member to protect the fan.

7. The system of claim 2 which further includes a sheet metal cage coupled to the housing member to provide a space for the module to reside.

8. The system of claim 7 in which the sheet metal cage further comprises a box shape.

9. The system of claim 8 in which the sheet metal cage includes upper and lower openings for the hook and snap portions.

10. The system of claim 8 in which the sheet metal cage includes an array of holes.

11. A system for locating a fan module on an exterior portion of a computer comprising:

a housing member coupled to the exterior portion of the computer, the housing member including a first electrical contact portion coupled to a power source of the computer, the housing member having a first aperture therein, the first aperture having a central portion, the first electrical contact portion being recessed in the first aperture and offset from the central portion of first aperture to be inaccessible to a user from the exterior portion of the computer;

a grill member containing an electrical portion of the module, the electrical portion further comprising a fan including a cable, and a plurality of contacts coupled to the cable, the plurality of contacts mateably engaging the first contact portion; the grill member including a snap portion and a hook portion, the hook portion engages the first aperture within the housing member, and wherein rotation of the grill member and engagement of the snap portion with a second aperture in the housing member facilitates attachment of the module to the exterior portion of the computer and engagement of the second contact portion with the first contact portion;

a guard member coupled to the grill member to protect the fan; and a sheet metal cage coupled to the housing member to provide a space for the module to reside.

12. The system of claim 11 in which the sheet metal cage further comprises a box shape.

13. The system of claim 12 in which the sheet metal cage includes upper and lower openings for the hook and snap portions.

14. The system of claim 13 in which the sheet metal cage includes an array of holes.

15. The system of claim 11 wherein the first aperture further comprises a shape, the shape being such that a finger of the user cannot be inserted through the first aperture to touch the first contact portion.

* * * * *